(12) United States Patent
Sakamoto et al.

(10) Patent No.: US 7,947,996 B2
(45) Date of Patent: May 24, 2011

(54) SEMICONDUCTOR LIGHT EMITTING ELEMENT

(75) Inventors: Takahiko Sakamoto, Anan (JP); Masahiko Onishi, Komatsushima (JP); Yoshiki Inoue, Anan (JP)

(73) Assignee: Nichia Corporation, Anan-shi (JP)

( * ) Notice: Subject to any disclaimer, the term of this patent is extended or adjusted under 35 U.S.C. 154(b) by 468 days.

(21) Appl. No.: 11/819,496

(22) Filed: Jun. 27, 2007

(65) Prior Publication Data

US 2008/0142821 A1 Jun. 19, 2008

(30) Foreign Application Priority Data

Jun. 28, 2006 (JP) .................................. 2006-178652
Jun. 20, 2007 (JP) .................................. 2007-163204

(51) Int. Cl.
*H01L 33/00* (2010.01)
(52) U.S. Cl. ........ 257/98; 257/88; 257/77; 257/E33.064
(58) Field of Classification Search .................. 257/98, 257/88, 77, 99, 81, E33.064
See application file for complete search history.

(56) References Cited

U.S. PATENT DOCUMENTS

| | | | | |
|---|---|---|---|---|
| 5,825,052 | A * | 10/1998 | Shakuda | 257/94 |
| 6,958,498 | B2 * | 10/2005 | Shelton et al. | 257/99 |
| 7,018,859 | B2 * | 3/2006 | Liao et al. | 438/22 |
| 7,355,209 | B2 * | 4/2008 | Tsai et al. | 257/79 |
| 2001/0042860 | A1 | 11/2001 | Hata et al. | |
| 2002/0179918 | A1 | 12/2002 | Sung et al. | |
| 2003/0173574 | A1 | 9/2003 | Koide et al. | |
| 2004/0124422 | A1 | 7/2004 | Sakamoto et al. | |
| 2005/0056865 | A1 * | 3/2005 | Tsuchiya et al. | 257/202 |
| 2005/0179045 | A1 | 8/2005 | Ryu et al. | |
| 2005/0212002 | A1 | 9/2005 | Sanga et al. | |
| 2005/0253161 | A1 * | 11/2005 | Horio et al. | 257/100 |
| 2006/0273324 | A1 * | 12/2006 | Asai et al. | 257/79 |

FOREIGN PATENT DOCUMENTS

| | | |
|---|---|---|
| JP | 09-232632 A | 9/1997 |
| JP | 2001-102631 A | 4/2001 |
| JP | 2001217456 A | 8/2001 |
| JP | 2002-016282 A | 1/2002 |
| JP | 2003-060236 A | 2/2003 |
| JP | 2003-133590 A | 5/2003 |
| JP | 2003-224297 A | 8/2003 |
| JP | 2003234501 A | 8/2003 |
| JP | 2004-128321 A | 4/2004 |
| JP | 2004-179347 A | 6/2004 |
| JP | 2004-221529 A | 8/2004 |
| JP | 2004228134 A | 8/2004 |
| JP | 2004228401 A | 8/2004 |
| JP | 2005-229085 A | 8/2005 |
| JP | 2005-317931 A | 11/2005 |
| JP | 2005-191326 A | 3/2008 |

* cited by examiner

*Primary Examiner* — Thinh T Nguyen
(74) *Attorney, Agent, or Firm* — Birch, Stewart, Kolasch & Birch, LLP

(57) ABSTRACT

It is an important factor in application to the illumination field and the like to obtain a characteristic excellent in power efficiency in a light emitting element. The present invention provides a semiconductor light emitting element including: first and second conductive type semiconductor layers; first and second electrodes respectively provided on the same plane sides as the first and second conductive type semiconductor layers; and a light emitting structure, provided with the second electrode and including the first and second conductive type semiconductor layers, wherein the first electrode provided on an exposed surface of the first conductive type semiconductor layer at least has a translucent first layer and a reflective second layer, and the first layer has projecting portions projected from both sides of the second layer in a cross section of the element crossing over the light emitting structure and the first electrode.

13 Claims, 6 Drawing Sheets

SEMICONDUCTOR LIGHT EMITTING ELEMENT

This application is based on and claims priority to Japanese Patent application Nos. 2006-178652 filed on Jun. 28, 2006 and 2007-163204 filed on Jun. 20, 2007, the contents of which are incorporated hereinto by reference.

BACKGROUND OF THE INVENTION

1. Field of the Invention

The present invention relates to a semiconductor light emitting element and a light emitting device using the same, and particularly, to an electrode structure of the light emitting element.

2. Description of the Related Art

A variety of researches have been made on the light emitting element using a nitride semiconductor, since light emission is obtained in the near-ultraviolet area to the red color area due to a wide band gap property of the light emitting element. A typical basic structure of the nitride semiconductor light emitting element is a structure where an n-type nitride semiconductor, an active layer and a p-type nitride semiconductor are laminated on a substrate, and respective electrodes are provided in the p-type layer and the partially exposed n-type layer. The structure of the light emitting element including the electrode structure has been under study. Especially in an effort to make the element high-powered, a variety of light emitting element structures and electrode structures have been proposed.

Patent 1: Japanese Patent Laid-Open Publication No. 2003-045898
Patent 2: Japanese Patent Laid-Open Publication No. 2005-229085
Patent 3: Japanese Patent Laid-Open Publication No. 2003-133590
Patent 4: Japanese Patent Laid-Open Publication No. 2004-179347
Patent 5: Japanese Patent Laid-Open Publication No. 2005-317931
Patent 6: Japanese Patent Laid-Open Publication No. 2001-102631
Patent 7: Japanese Patent Laid-Open Publication No. 2004-128321
Patent 8: Japanese Patent Laid-Open Publication No. 2002-016282
Patent 9: Japanese Patent Laid-Open Publication No. 2002-221529
Patent 10: Japanese Patent Laid-Open Publication No. H9-232632 (Paragraph Nos. 51-63, FIGS. 7-9)

Proposals that have conventionally been made relate to a structure where a transparent electrode such as ITO (indium tin oxide) is used for an n-electrode provided in the n-type layer (the Patents 1 and 2), and a structure as a double-layer structure where a metal layer/reflection layer is superposed in part (the Patents 3 and 10) or all (the Patents 4 and 5) of the upper layer.

Other proposals include: lowering the n-electrode with respect to light emission from the active layer to suppress a light shielding effect (the Patent 6); and tilting the side face of the n-electrode to enhance a reflection effect (the Patent 7). Further, providing a concavo-convex structure inside the light emitting structure to enhance light extraction efficiency has also been proposed (the Patents 8 and 9).

SUMMARY OF THE INVENTION

In the above-mentioned related techniques, in using the transparent conductive film for the n-electrode, problems occur in terms of current spread/uniformity, high resistance of the element, and an increased voltage value (Vf). In adopting the latter proposal, problems occur in terms of light absorption/loss due to an electrode material, variations in shape and mass productivity. Improvement in power efficiency (lm/W) is an important requirement for the light emitting element, especially the nitride semiconductor light emitting element, in high power use such as the illumination field. However, the above problems cause a decrease in power efficiency and prevent applications to such a field and use.

An object of the present invention is provide a light emitting element and a light emitting device, which use a translucent electrode as an electrode to be provided adjacent to a light emitting structure, to realize at least any of, preferably many of, low resistance, high power, high power efficiency (lm/W), high mass productivity, and low cost, for the element.

A light emitting element according to the present invention includes: first and second conductive type semiconductor layers; first and second electrodes respectively provided on the same surface side as the first and second conductive type semiconductor layers; and a light emitting structure, provided with the second electrode and including the first and second conductive type semiconductor layers, wherein the first electrode provided on an exposed surface of the first conductive type semiconductor layer at least has a light transmissive first layer and a reflective second layer, and the first layer has projecting portions projected from both sides of the second layer in a cross section of the element crossing over the light emitting structure and the first electrode.

At least part of the first electrode is preferably arranged in a depressed portion depressed into the light emitting structure in the first conductive type semiconductor layer exposed region, and the projecting portion is provided in a direction opened from the depressed portion of the light emitting structure.

The depressed portion preferably surrounds not smaller than half of a peripheral length of the first electrode.

The projecting portion of the first layer is preferably provided in a substantially whole area of the periphery of the second layer.

The first electrode preferably has an external connecting portion and an extending portion extending from the external connecting portion, and the first and second layers are preferably respectively provided in the external connecting portion and the extending portion.

The first electrode is preferably sandwiched between the light emitting structure portions on the electrode forming surface side.

The light emitting structure portion is preferably provided as surrounding a substantially whole area of the periphery of the first electrode.

One of the projecting portions on both the sides is preferably disposed on the light emitting structure portion side and the other is preferably disposed on the outside of the element.

In the light emitting element according to the present invention, the upper layer side and the lower layer side of the first electrode have respective optical properties, light transparency, and reflectivity, and located and structured preferably with the adjacent light emitting structure, thereby giving effects such as improvement in power efficiency, element resistance, reduction in Vf and mass productivity.

Further, a light emitting device using such a light emitting element is excellent in electric and optical characteristics.

DETAILED DESCRIPTION OF THE PREFERRED EMBODIMENTS

Figure 1A:
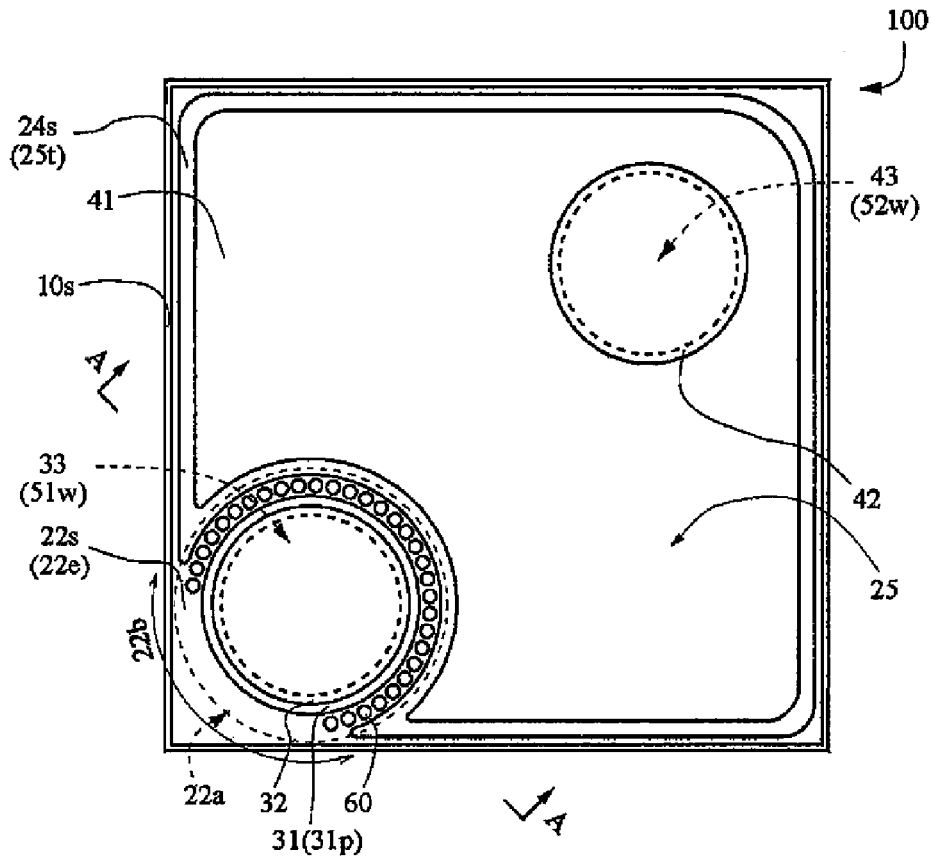
FIG. 1A is a plan schematic view of a light emitting element according to an embodiment of the present invention.

The preferred embodiments of the present invention will be described below with reference to the accompanying drawings. However, the light emitting elements and light emitting elements discussed below are merely given to embody the technological concept of the present invention, and the present invention is not limited thereto. Unless otherwise specified, the sizes, materials, shapes, relative layouts, and so forth of the constituent members are for illustrative examples, and do not intend to limit the invention therein. The sizes, positional relationships, and so forth of the members shown in the drawings may be exaggerated for clarity. In each constituting component of the present invention, multiple components may be constructed using the same member so that one member can serve as multiple components, or vice versa, a function of a member may be shared by multiple members.

First Embodiment

Figure 1B:
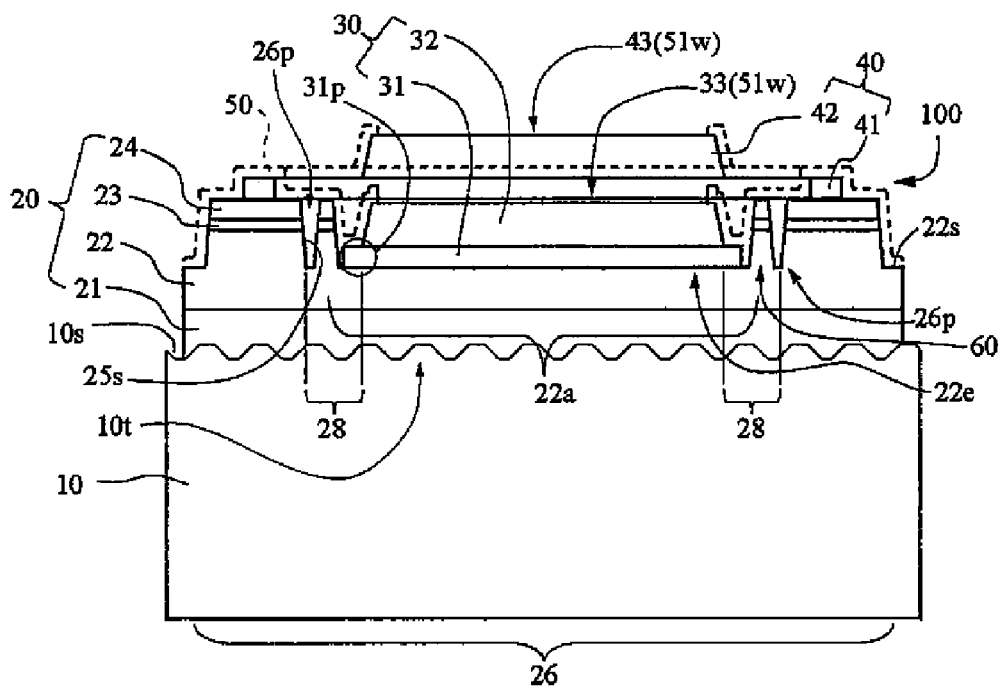
FIG. 1B is a cross-sectional schematic view taken along a line A-A of FIG. 1A.

With reference to FIG. 1, a configuration of a specific example of an LED 100 according to a first embodiment is described. Here, FIG. 1A is a schematic view illustrating a plane of an LED according to the first embodiment seen from the electrode arrangement face side, and FIG. 1B is a schematic view illustrating a cross section along a line A-A of FIG. 1A.

A structure of a light emitting element of FIG. 1 is a element structure as described below. The element has a semiconductor structure 20 comprised of a lamination structure obtained by laminating an n-type nitride semiconductor layer 22 as a first conductive type layer, an active layer 23 as a light emitting portion, and a p-type nitride semiconductor layer 24 as a second conductive type layer on a substrate 10 via a underlying layer 21 such as a buffer layer. Part of the n-type layer 22 is exposed to be provided with an n-electrode (first electrode) 30. A p-electrode (second electrode) 40 is provided on a p-type layer 24s as a surface 25t of a light emitting structure 25 provided with the first and second conductive type layers (and the active layer therebetween).

Further, in a specific example according to FIG. 1, the first electrode 30 has a rectangular element structure 26 and a light emitting structure 25 inside the electrode forming surface. A first conductive type exposed region 22s is provided in the vicinity of the corner of the first electrode such that the light emitting structure is recessed inward, where an electrode forming region 22e of a depressed portion 22a is provided. The light emitting structure 25 includes an inner wall face 25s so as to surround half of or larger than the peripheral length of the circular electrode 30, and is provided along with the electrode 30. Moreover, a plurality of protrusion portions 60 are provided so as to surround a larger peripheral length of the electrode than the light emitting structure. Namely, the n-electrode is provided in the depressed portion 22a curved in a circular arc shape into the light emitting structure. The protrusion portions 60 are provided together so as to surround the outer edge of the depressed portion 22a in the length not smaller than half of the peripheral length of the electrode (in circular arc shape of about 257 degrees in this example). Further, the light emitting structure 25 (side face 25s) with an opening 22b having a large width and angle is provided together so as to surround the outer edge of the depressed portion 22a in the length smaller than the protrusion portion region and not smaller than half of the peripheral length of the electrode 30 (in circular arc shape of about 235 degrees in this example).

Moreover, the first electrode 30 is structured to have lamination of a first layer 31 as a light transmissive transparent conductive film provided on a lower layer side and a second layer 32 as a reflective metal film on an upper layer side above the lower layer side. The second electrode 40 is structured to have an electrode 41 as a translucent transparent conductive film provided almost all over an upper face 25t of the light emitting structure and a pad electrode 42 provided on the electrode 41. At this time, the first layer 31 on the lower layer side of the first electrode 30 is provided so as to have a larger width in the cross section and a larger area in the plane than those of the upper layer side, the second layer 32 on the upper layer side is provided so as to have a small width in the cross section and a small area in the plane. In addition, the upper layer is provided on only part of the lower layer, and a projecting portion 31p of the lower layer is provided on the whole periphery of the upper layer.

Figure 3A:
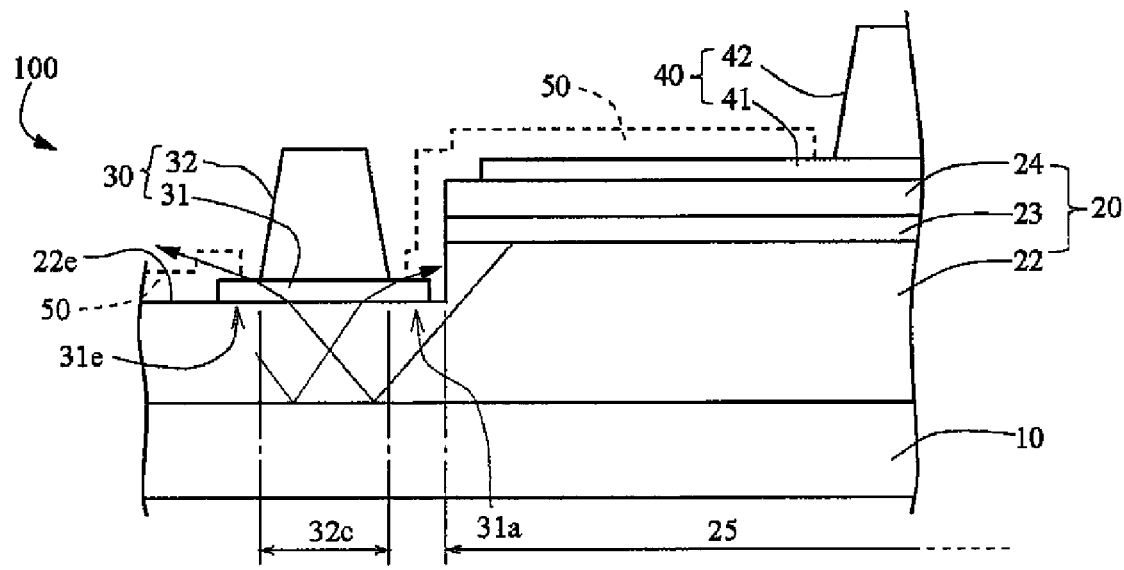
FIG. 3A is a cross-sectional schematic view of a light emitting element according to an embodiment of the present invention.

As thus described, with the respective projecting portions 31p provided on the light emitting structure 25 (its side wall 25s) side and the opening 22b side opened from the light emitting structure 25 side, as shown in FIG. 3A, light on the second layer underside can be preferably discharged to the outside of the element, and particularly by the protrusion portion on the opening 22b side, light is extracted preferably to the side opposed to the light emitting structure, desirably to the exterior side of the element. Further, with an ohmic electrode on the lower layer side, particularly in the first conductive type layer 22, having a large width and a large area, contact area/width with the first conductive type layer 22 can be made large so as to reduce contact resistance, and further, element resistance as well as a driving voltage Vf of the element 100. Meanwhile, with such a wide, large-area lower layer having translucency, light propagates through the semiconductor layer under the first electrode, and it is possible to reduce absorption and loss of light on the interface between the propagation layer and the electrode, or emitted light from the adjacent light emitting structure side face 25s, so as to improve optical output, and further, power efficiency of the element.

Moreover, since the distance between each end on the light emitting structure side of the upper layer and the lower layer and the side face of the light emitting structure adjacent to the first electrode 30 is arranged longer on the upper layer side than on the lower layer side, it is possible to reduce an amount of the emitted light from the light emitting structure which reaches the second layer. Particularly, as shown in FIG. 1, the second layer exerts a larger effect when having a large film thickness as compared with that of the first layer, which is desirable. Further, the amount of the emitted light is larger when the first layer is lower than the light emitting portion (active layer) in the light emitting structure, which is desirable. Further, when the light emitting structure portion provided along with the first electrode surrounds a larger region of the periphery of the first electrode, the emitted light from the light emitting structure side face 25s tends to be confined inside the electrode forming region, namely the depressed portion, which is preferably avoided.

Further, in the light emitting element which includes the shape of the light emitting structure having high light confinement effect as thus described, when a protrusion portion of a structure having an optical function is provided between the light emitting structure and the first electrode, the amount of the aforesaid emitted light reaching the second layer can be reduced, namely, the confinement effect can be reduced by an optical function exerted by the protrusion portion, e.g. reflecting/scattering function, which is desirable. It is especially desirable when the peripheral region is large, and further desirable when the depressed portion has a length not smaller than half of the above-mentioned peripheral length. Moreover, as in FIG. 1, a protrusion/recess structure 10t having the same optical function as the protrusion portion 60 in the semiconductor structure 20 may be provided also on the substrate 10.

Although detailed description on configurations in the present embodiment and the present invention is given below, the present invention is not limited to the present embodiment, and can be applied to other embodiments, and can also be applied by combining such configurations as appropriate.

[Semiconductor Structure/Element Structure/Light Emitting Structure]

In the light emitting element structure, the semiconductor structure 20, especially a lamination structure where layers are laminated, is provided on a substrate as shown in FIG. 1 and the like. Other than this, it is possible to provide a element structure without a substrate, which is realized by, e.g., removal of the substrate, and further without a layer off a element active region, such as a below-described underlying layer, and a element region/structure including a substrate which is realized by providing a conductive type region in the substrate. In the example of FIG. 1, the light emitting structure 25 is a structure provided with the first and second conductive type layers 22 and 24 and the active layer 23 therebetween. Further, the light emitting structure 25 is a structure provided with a light emitting region by the semiconductor structure 20, and includes an electrode structure provided with the first and second electrodes 30 and 40 on the same surface side. This electrode structure is a structure where at least the first electrode 30 or the first conductive type exposed region 22s and a region for the light emitting structure 25 are arranged inside the element region 26 inside the substrate face. The light emitting structure 25 may be a structure provided with the active layer or a light emitting layer between the first and second conductive type layers. Other than this, the light emitting structure 25 may be a structure with a p-n junction serving as a light emitting portion, a p-i-n structure, a mis structure, or the like. Moreover, a semi-insulating/insulating i-type layer or reverse conductive type layer/region may be provided in the element structure or in part of the conductive-type layers. For example, the element structure may be a structure provided with: a current blocking layer/region formed of a semi-insulating/insulating i-type layer or the like which controls a current injecting region; a reverse tunnel layer formed in reverse conductive type for junction with the electrode; and the like.

A semiconductor to serve as the light emitting structure 25, e.g. a later-described nitride semiconductor of a specific example in FIG. 1, is formed by a growth method such as MOVPE (metal-organic vapor phase epitaxy). Examples of a growth substrate of the nitride semiconductor may include a sapphire (C-plane, A-plane, R-plane) substrate and a spinel ($MgAl_2O_4$) substrate, and further, a Si substrate and a semiconductor substrates made of SiC, GaN, or the like. Examples of the growth method may include MOVPE and MOCVD (metal-organic chemical vapor deposition), and further, HVPE (hydride vapor phase epitaxy) and MBE (molecular beam epitaxy). The substrate is desirably a translucent substrate, since making the element structure where the first and second electrodes are formed on the same plane excellent in light extraction both on the substrate side and the electrode forming surface side. Further, when the substrate is made of a heterogeneous material with a refractive index different from that of the nitride semiconductor, light can be extracted preferably in a element where light is emitted from the electrode forming surface side. In using a substrate with poor optical transparency, e.g. a semiconductor substrate and a metal substrate, the element structure may be formed such that a light reflection layer is provided between the substrate and the semiconductor. Further, as a gallium nitride compound semiconductor material, a material of a general formula: $In_xAl_yGa_{1-x-y}N$ ($0 \leq x \leq 1$, $0 \leq y \leq 1$, $0 \leq x+y \leq 1$), especially a material of binary or ternary crystal mixes as described later, can be preferably used as described later, and in addition to this, a material obtained by replacing part of B as the group III element and N as the group V element by P and As may be used. Further, as for a nitride semiconductor of each conductive type, the n-type nitride semiconductor is added with, as n-type impurities, one or more of the IV group elements, and the VI group elements and the like, such as Si, Ge, Sn, S, O, Ti, Zr and Cd, desirably Si and Ge. The p-type nitride semiconductor layer contains Mg, Zn, Be, Mn, Ca, Sr or the like as p-type impurities. Besides the nitride semiconductor, this can also be applied to other semiconductor materials for a GaAs or GaP-based compound semiconductor, and an AlGaAs- or InAlGaP-based compound semiconductor.

[Specific Example of Light Emitting Element and Manufacturing Example Thereof]

As a specific semiconductor structure or lamination structure 20 of the light emitting element in FIG. 1 according to the present embodiment, a element structure for blue light emission (emission wavelength: 465 nm) can be obtained by forming the following structure. A GaN buffer layer having a film thickness of 20 nm and a GaN layer having a film thickness of 1 μm are formed as the underlying layer 21 on the substrate 10.

As the first conductive type layer 22 (n-type layer) on the underlying layer 21, an n-side contact layer of Si ($4.5 \times 10^{18}$/cm$^3$) doped GaN with a film thickness of 5 μm is formed, and a GaN layer of 0.3 μm, a Si ($4.5 \times 10^{18}$/cm$^3$) doped GaN layer of 0.03 μm, a GaN layer of 5 nm, and layers of alternately stacked ten GaN layers with a film thickness of 4 nm and $In_{0.1}Ga_{0.9}N$ layers with a film thickness of 25 nm, to form a multilayer between the contact layer and the active layer.

As the active layer 23 on the n-type layer, six undoped GaN barrier layers with a film thickness of 25 nm and six $In_{0.3}Ga_{0.7}N$ well layers with a film thickness of 3 nm are alternately repeatedly laminated, and a barrier layer is finally laminated, to form a multiple quantum well structure.

As the second conductive layer (p-type layer) on the active layer, five Mg ($5\times10^{19}/cm^3$) doped $Al_{0.15}Ga_{0.85}N$ layers with a film thickness of 4 nm and five Mg ($5\times10^{19}/cm^3$) doped $In_{0.03}Ga_{0.7}N$ layers with a film thickness of 2.5 nm are alternately repeatedly laminated, and the AlGaN layer is finally laminated, to form a p-side multilayer film layer, and a p-side contact layer of Mg ($1\times10^{20}/cm^3$) doped GaN having a film thickness of 0.12 μm is formed. These layers are formed, for example, of nitride semiconductor crystal having grown along the c-axis on the C-plane sapphire substrate by MOVPE.

The first conductive type layer exposed region 22s and the light emitting structure region 25 are defined by processing/removing part of the lamination structure 20 by etching into a desired shape by etching or the like. A specific example is that, in the above structural example, a mask of $SiO_2$ or the like in a desired shape is provided by photolithography from the p-type layer side, and part of the n-type contact layer in its depth direction is removed by etching such as RIE (reaction ion etching), to form the first electrode forming region 22e (the depressed portion 22a in the example of FIG. 1), the protrusion portion 60, and the exposed region 22s. As the first layer 31 of the first electrode 30 (n electrode) disposed on the exposed first conductive type layer (n-side contact layer in the n-type layer) and the ohmic electrode 41 of the second electrode 40 (p-type layer side), ITO (about 170 nm) is formed. The formation method is that, for example, a resist mask is formed on the semiconductor structure by photolithography after formation of the ITO film, and ITO is partially removed by etching to be formed into a desired shape on each conductive type layer. A film having a structure where Rh (about 100 nm)/Pt (about 200 nm)/Au (about 500 nm) are laminated in this order as the second layer 32/pat electrode 42 is formed on part of the first layer 31 and the translucent electrode 41. For example, after formation of the mask, the above laminated film is formed by photolithography and the mask then is lifted off to form the film into a desired shape. As thus described, the first and second electrodes 30 and 40 can be simultaneously formed, and specifically, the respective layers of those electrodes can be formed in the identical process, so as to reduce the number of manufacturing steps, which is desirable. However, the layers may be formed of different materials or different lamination structures in different steps. Further, in this example, as in the second electrode, the first layer 31 of the first electrode provides an ohmic portion, and the second layer 32 provides the external connecting portion 33.

In the example of FIG. 1, as shown by the dotted lines, the external connecting portions 33 and 43 of the electrodes are exposed to provide the protective film 50, such as $SiO_2$, which covers other regions. Further, in the example of FIG. 1, a substrate exposed region 10s is provided by removing the outer edge of the element region 26 by etching until the substrate is exposed. This exposed region 10s can be functioned as a division groove for dividing a substrate (wafer), which is desirable. A element structure with exposed region 10s not particularly provided may also be used. Finally, in this example, the substrate 10 is divided into 320 μm square each to obtain LED chips. It should be noted that in this example, a substrate exposed width of the LED chip is about 5 μm, and an n-type layer exposed width of the rim section is about 15 μm. A wafer before the division is divided at its central part having a width twice as large as those widths is divided as a divided position, to obtain the LED chips.

Dimensions of the structures shown in the above example are as follows. A thickness of the substrate 10 is in the order of 50 to 200 μm (about 90 μm in the above example). In the lamination structure 20, a thickness of the underlying layer 21 is in the order of 1 to 2 μm, a thickness of the n-type semiconductor layer 22 is in the order of 1 to 2 μm, a thickness of the active layer and light emitting layer 23 is in the order of 50 to 150 nm, a thickness of the p-type semiconductor layer 24 is in the order of 100 to 300 nm, a height of the light emitting structure from the surface of the n-type exposed layer 22s is in the order of 1 to 3 μm (about 1.5 μm in the above example), thicknesses of the first layer (first electrode), the second electrode (lower layer) are in the order of 0.01 to 0.5 μm, a thickness of the second layer and pad electrode is in the order of 0.3 to 1.5 μm, and a width or diameter of the external connecting portion and pad electrode are in the order of 50 to 150 μm. Further, in the above example, the first layer 31 is provided with its projecting portion 31p having a width of about 5 μm in the whole periphery of the second layer 32, and the protrusion portion 60 or protrusion/recess structure 10t are provided with its width or diameter being about 2 to 3 μm at intervals of about 1 to 2 μm.

[Electrode/Electrode Structure]

As shown in the above example, the electrode of the light emitting element 100 is comprised of the second electrode 40 provided on the surface 25t of the light emitting structure and the first electrode 30 provided on the first conductive type layer 22s separated from the light emitting structure 25. As thus described, it is desirable to provide the conductive type electrodes on the same plane side of the substrate 10, namely on the semiconductor structure. Further, the substrate 10 is not limited to the substrate for growth of a semiconductor layer described in the above example, and may take a structure such that the substrate is polished, LLO (laser lift off) or the like and then removed, or a structure such that the semiconductor structure with its substrate removed is provided on a member, or a substrate, as another carrier. In the example of the above light emitting element, the light emitting element is structured such that the electrode forming surface side is a main light emitting side.

Accordingly, the lower layer side of the second electrode 40 on the light emitting structure 25 is formed for ohmic contact to have a wider width and a larger area than those of the upper layer side as shown in the example of FIG. 1, and functions as a current diffusion conductor. Further, a translucent material may be used for rendering the light extraction from the light emitting structure desirable. Other than this, a light transparent structure, e.g. a structure of a light shielding member in porous or lattice form, can be used. Meanwhile, the first layer 31 on the lower layer side of the first electrode 30 mainly functions for ohmic contact. In the structure where the exposed region 22s and the light emitting structure 25 are arranged inside the plane on the first conductive type semiconductor, the light emitting structure and the first conductive type semiconductor region of the region extending from the light emitting structure to the outside (exposed region 22s) mainly serve as a current diffusing conductor into the plane, unlike the lower layer side electrode 41 as the diffusing body. It should be noted that a interconnect portion 34 of the first electrode 30 functions to supplement the diffusion.

Figure 5:
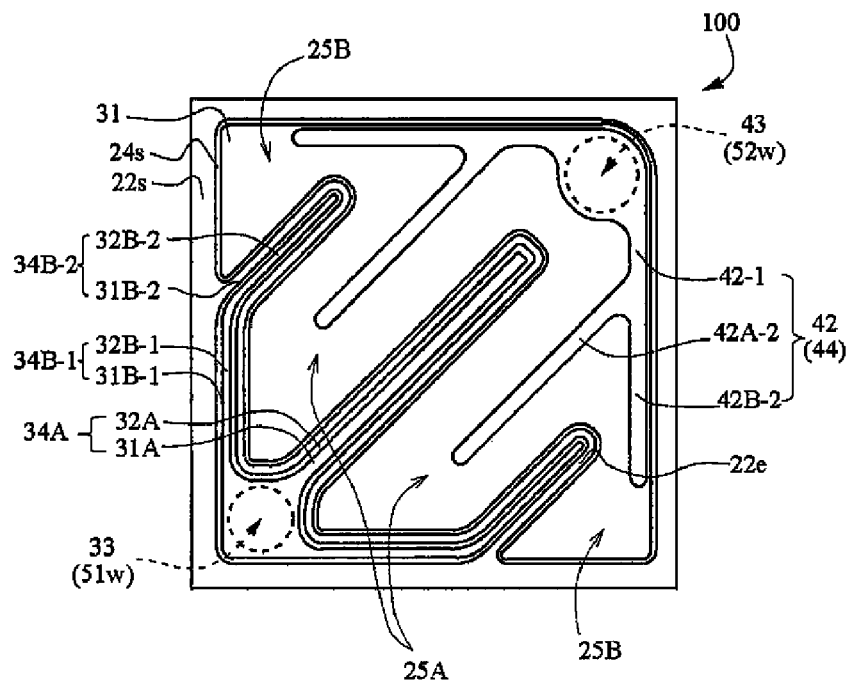
FIG. 5 is a plan schematic view of a light emitting element according to an embodiment of the present invention.
Figure 6:
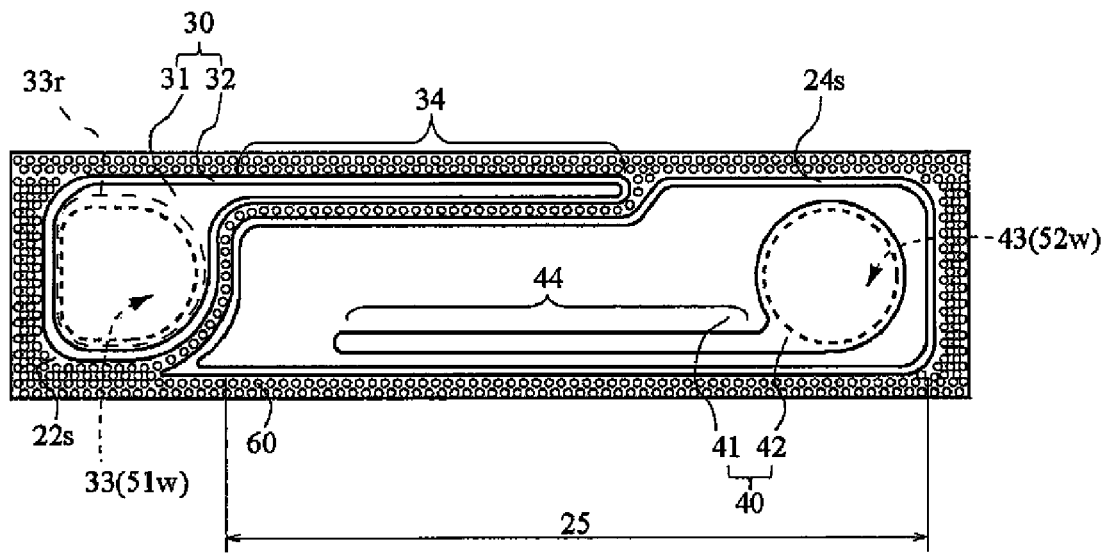
FIG. 6 is a plan schematic view of a light emitting element according to an embodiment of the present invention.

The light emitting structure 25 inside the light emitting element 100 may be provided as the depressed portion 22a to be curved into the light emitting structure to serve as the first electrode forming region 22e in part of one light emitting structure as shown in FIGS. 1 and 2, for example, at the corner as in FIG. 1, and one longitudinal end as in FIG. 2, or the one end and part of the side face as in FIG. 6. Moreover, as shown in FIGS. 3C and 4 to 6, in the case of the large-area light emitting structure 25, the light emitting structure 25 having a plurality of structure portions 28A to 25B in which part of the structure is partially separated in the first electrode forming region 22e/first conductive type layer exposed region 21s, and a element structure with its area increased, or in the case of the light emitting structure having been made longer as in FIG. 6, a structure where the first electrode 30 is provided adjacently to the light emitting structure portions may be formed. In such a case, as shown in the figure, desirable current diffusion is implemented by an electrode structure where the extending portions 34 and 44 as wires are provided on the first conductive type semiconductor, the light emitting structure/second electrode lower layer side, or an electrode structure comprised of a plurality of mutually separated electrodes.

As the first layer 31 of the first electrode 30 and the contact layer 41 of the second electrode, translucent films are formed in the light emitting structure where the first and second electrodes are provided on the substrate and the electrode forming side is the main light emitting side. A conventionally known electrode can be used, and as the translucent conductive film, the electrode (first layer) in the nitride semiconductor, a metal containing at least one selected from the group consisting of Ni, Pt, Pd, Rh, Ru, Os, Ir, Ti, Zr, Hf, V, Nb, Ta, Co, Fe, Mn, Mo, Cr, W, La, Cu, Ag, and Y may be used, or an alloy of those metals and a laminated structure of those metals/alloys may also be used. Further, a metal compound with In, Sn, Ga, Zn, Cd, Be, Mg or the like, and a compound thereof such as a conductive oxide or nitride may also be used. Examples of the conductive metal oxide (oxide semiconductor) may include tin doped oxide indium (indium tin oxide: ITO) having a thickness of 5 nm to 10 μm, ZnO (zinc oxide), $In_2O_3$ (indium oxide), $SnO_2$ (tin oxide), and a compound of these, e.g. IZO (indium zinc oxide). An appropriate material is selected according to a semiconductor material, light emitting wavelength and the like. Further, as a doping material for use in the conductive material, a constitutional element of the semiconductor, a dopant of the semiconductor or the like can be used.

Figure 3B:
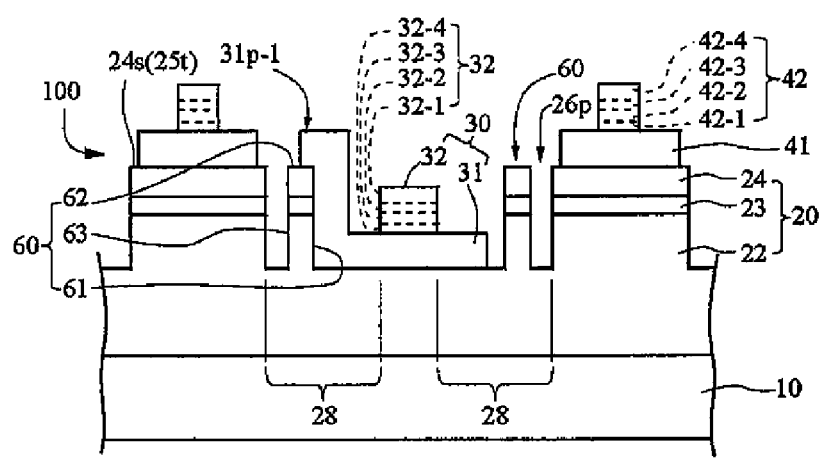
FIG. 3B is a cross-sectional schematic view of a light emitting element according to an embodiment of the present invention.

As in the above-mentioned specific example, the metal film/reflective film (second layer 32, pad electrode, upper layer) arranged on each of the upper layer sides of the first and second electrodes 30 and 40 is preferably made of the identical material and has the identical configuration, and further, in the identical process. As the metal film/reflective film, a conventionally known electrode is used, and a below-described metal having a high reflectivity can be used. The second layer/pad electrode on each of the upper layer sides of the first and second electrodes has a multilayer film structure having at least two layers: a reflection layer; and a metal layer for a pad portion/for current diffusion, desirably at least three layers: a reflection layer 32-1 (42-1); a barrier layer 32-2 (42-2); and a metal layer 32-3 (42-3) for the pad portion, in this order as shown in FIG. 3A. As the reflection layer, a material with a high light reflectance with respect to light emission of the element may be used. Specific examples of the material may be Ag, Al and Rh, and Rh is preferably used since being stable. Further, the reflection layer is arranged on the contact side with the light transmissive film (first layer, lower layer side). The barrier layer prevents diffusion in the upper and lower layers thereof and protects the layers. For the barrier layer, a material having a high melting point such as W and Mo, elements of the platinum group, Ni, Au or the like, preferably Pt, W, Mo or Ni, is used. As the material for external connection, Au or Al is used. Although the respective film thicknesses of the layers are not particularly limited, for example, the film thicknesses of the layers are from 0.05 to 5 μm, and the layers are formed such that the reflection layer is thinner than other upper layers and the layers on the upper layer side are relatively thicker than the reflection layer. Further, each of the above layers may be configured using a multilayer film in addition to a single film, or as shown in FIG. 3B, the layers are configured such that a protective layer and an adhesive layer, such as Ti and Ni, may be interposed between each of the layers and between the first layer and the layers so that the second layer is composed of not less than four layers (32-1 to 32-4, 42-1 to 42-4). Specific examples may include a structure where Rh/Pt/Au, Al/Pt/Au, Ti (thin film adhesive layer)/Rh (reflection)/Pt (barrier)/Au (surface layer), Al (reflection)/W/Pt/Au (surface layer), or Ni (thin film adhesive layer)/Ag (reflection)/Ni/Ti/Au are laminated in this order.

Here, as shown in FIGS. 1, 2 and 3A, when the second layer/upper layer has a structure in a trapezoidal shape in the cross section where the first layer side is wider and an inclined structure where the upper surface side is less closer to the light emitting structure side face 25s in terms of manufacturing, a directivity and an axial light intensity can be enhanced due to a light reflecting function so that an opening width on the light emitting structure upper face 25t can be widened, which is desirable. Meanwhile, the second layer may have a structure in a rectangular shape, inverted trapezoidal shape in the cross section, with an inverted inclined plane. Further, when the second layer/upper layer has a multilayer film structure, the multilayer may be formed such that, in the lamination structure in FIG. 3B, the upper layer side shown in FIG. 3A is the lower layer side, and particularly its side face is covered. Moreover, the reflection layer on the upper layer underside typically has a higher reflectivity than the films on and over the reflection layer.

As shown in FIG. 3A, the first layer preferably eliminates light to a second layer region 32c by the projecting portion from the second layer. The first layer is at least projected to a side 31e opposed to the light emitting structure 25, and desirably to a side 31a on the light emitting structure portion 25 side, namely projected from both sides of the light emitting structure portion and the first electrode in the cross section, and is further desirably provided in a substantially whole periphery of the second layer. In addition, since the first layer is formed with a large sectional width and a large area as compared with those of the second layer, it is possible to increase a contact area with the first conductive type layer so as to reduce contact resistance and further reduce the driving voltage Vf of the element. Meanwhile, as shown in FIG. 3A, in the projecting portion projected from the second layer, light that propagates in the semiconductor region lower than the electrode forming position can be extracted preferably to the outside of the element, particularly to the electrode forming surface side, so as to reduce loss of light due to the wide, large-area electrode. Namely, as shown in FIG. 3A, a space between the light emitting structure side face and the second layer side face which are adjacent to each other preferably eliminates light to the second layer region 32c by the projecting portion from the second layer, as shown by the arrows in the figure. The first layer is at least projected to a side 31e opposed to the light emitting structure 25, and desirably to a side 31a on the light emitting structure portion side, namely in both sides of the light emitting structure portion and the first electrode in the cross section, and further desirably projected from a substantially whole periphery of the second layer. Particularly as thus described, the opposed side 31e is desirably the opening 22b in the light emitting structure, and further desirably a element outer edge side.

[Light emitting structure/electrode structure] The light emitting structure may be either of a structure in single form in the light emitting region as shown in FIGS. 1, 2 and 6, and a structure partially comprised of the light emitting structure portions 25A to 25C separated by the first conductive type layer exposed region 22s/first electrode forming region 22e as shown in FIGS. 3C and 4 to 6, and is selected according to the area and characteristics of the element. The light emitting structure 25 and the first electrode 30 are not necessarily in a relation of one to one as shown in the figure, and may be in another relation such as two to one as in the light emitting structure sandwiched between the first electrodes 30, and may have a structure at least having a pair of the light emitting structure portion and the first electrode 30 provided along therewith.

As seen in the cross-sectional views, a basic light emitting structure has a structure portion where the first electrode 30 is provided along with the light emitting structure 25. Therefore, the electrode structure according to the present invention is desirably arranged in such a region.

When the area/width of the first electrode 30 are increased, a distance between the electrode end and the light emitting structure portion side face becomes shorter, and it is thus desirable to form a structure where the translucent first layer on the lower layer side is arranged closer to the light emitting structure and the second layer on the upper layer side on the first layer is arranged less closer to the light emitting structure. As shown in the figures, particularly in a region where the light emitting structure that surrounds part or the whole of the first electrode as the outer edge thereof, the effect of the electrode structure according to the present invention is enhanced.

When a region of the light emitting structure 25 adjacent to the first electrode 30 is one side of the first electrode 30, e.g. the side adjacent to the light emitting structure, or half or more of the peripheral length of the electrode, the present invention efficiently functions, which is desirable. It is especially desirable when a region is formed with its one side opened in the external direction of the element or in the extending direction to the outer connecting portion of the first electrode 30 and with its other side opposed to the light emitting structure 25 and blocked, having a structure as the depressed portion in FIGS. 1 and 2. Further, when such a region is a blockage region surrounded by the light emitting structure in its inside as shown in FIG. 4, light is preferably extracted from the small electrode forming region 22e, which is desirable.

Specifically, in such a region, at least partial region of the side face 25s of the electrode side of the light emitting structure 25 is structured to form inner walls opposed to each other so as to make light emitted from the side face and the exposed portion of the first conductive type layer easy to be confined. Therefore, with the electrode structure according to the present invention applied, it is possible to reduce light confinement and light absorption or loss by the electrode.

As shown in the figure, the structure of the first layer 31 and the second layer 32 is desirably that the second layer 32 is provided on part of the first layer 31, and further that the projecting portion 31p of the first layer 31 is provided on the whole periphery of the second layer 32 as shown in an example of a second embodiment to be later described. For example, in consideration of adhesiveness in the case of the second layer extending toward the outside of the first layer, the second layer is desirably provided inside the first layer. Meanwhile, the layers may be configured such that part of the region of the second layer end may be superposed almost identically on the first layer end, and specifically, a partial end agrees with the aforesaid light emitting structure 25 side.

Further, with a length of projection in the width direction of the electrode extending portion 34 (44) taken as a reference, the length of the projection of the end is made not larger than double the second layer width so that current diffusion/uniformity can be made preferable, which is desirable. As shown in examples of FIGS. 4 to 6, this can be applied, for example, to a configuration where the projection width of the projecting portion in the external connecting portion 33 differs from that of the extending portion 34. Moreover, the width of the projecting portion can be changed according to the external connecting portion and the extending portion of the electrode such as the width of the second layer.

The effect of the first layer can be made higher in the first electrode of the first conductive type semiconductor layer extending from the second electrode on the light emitting structure portion to the outside than in the second electrode. Further, the effect can be made higher on a side 32e opposed to the projecting portion 31a projected from the upper layer 32 (its region 32c) to the light emitting structure 25 side than in the projecting portion 31a. The effect can be made high preferably on the side opened from the light emitting structure 25 adjacent to the electrode, and further preferably on the periphery side of the element. A specific structure of the latter is that in the projecting portion projecting from the upper layer to both sides thereof in the cross section obtained by cutting the first electrode and the light emitting structure portion, one is arranged on the light emitting structure portion side and the other is arranged on the side opposed thereto. The former improvement in effect is attributed to that, in the second electrode on the light emitting structure 25, the light shielding and light loss effects on the upper layer 42 are low since the area and occupancy ratio of the lower layer are large and those of the upper layer are small as compared with the lower layer, and light emitted from the light emitting layer 23 in a variety of directions reach the upper layer and thereby controlling those lights are difficult. On the other hand, in the first electrode, as shown in the figures, since light that propagates through the first conductive type semiconductor layer in the electrode forming region out of the light from the light emitting layer 23 is made up largely of a component with a high angle relative to the exposed surface 22e of the electrode forming, the light control function as shown by the arrows in the figure can be preferably exerted.

Moreover, the light emitting structure portion side 32a of the projecting portion is put in contrast with the side 32e opposed thereto in the latter structure. As described above, light extracted from the projecting portion 32a on the light emitting structure portion side is separated from the light emitting structure portion adjacent to the upper layer 32, to exert the effect of making a light extraction window large. However, since the light is reentered into the adjacent light emitting structure portion or reflected or absorbed by the upper layer, the probability of ultimate extraction of the light, having been extracted from the projecting portion, to the outside of the element becomes small. On the other hand, on the side opposed thereto, such a problem is reduced, and hence light control by the lower layer and light extraction by the projecting portion efficiently function. In particular, when the opposed side 32e is a region closed from the light emitting structure portion adjacent to the first electrode 30, its function is enhanced, which is desirable. When such a region is on the element periphery side, the light is extracted directly to the outside of the element, which is most desirable.

[Protrusion portion/optical structure portion] It is desirable to provide a structure portion such as the protrusion portion 60 having optical functions such as reflection, scattering, diffraction and function of an exit aperture, between the first electrode 30 and the light emitting structure 25 as shown in FIGS. 1, 2 and 3B. This is because, as described above, an amount of the emitted light reaching the second layer surface from the light emitting structure side face 25s can be reduced, and further, a function to reflect light from the projecting portion 31a to the light emitting structure 25 side, for example, reflection on side faces 61 and 62 and an upper face 63, occurs. Such an optical structure portion is desirably formed of a light transmissive material in which light absorption and loss are low, such as the protrusion/recess structure 10t on a surface of the substrate, e.g. the surface on the semiconductor layer side, and a protrusion/recess structure provided on a exposed surface of the semiconductor layer and the light transmissive film on that surface, e.g. the protective film 50. Moreover, so far as the functions of reflection and scattering are concerned, a metal protrusion portion or protrusion/recess portion can be provided. Since the region between the electrode and the light emitting structure is a small region, when the region is formed of a semiconductor structure separated desirably from the lamination structure of the semiconductor, specifically separated from the light emitting structure, the region has high accuracy as well as high density, to enhance optical function, and further the region is formed of a similar translucent material to the material for the light emitting element, which is desirable. Specifically, as shown in the figures, a separation groove 26p is provided from the light emitting structure 25, so as to be provided as the protrusion portion 60 to be separated. Although the protrusion portion 60 is formed to be separated from the light emitting structure on the first conductive type layer 22 in the examples (plane view) of FIGS. 1, 2 and 6, an aperture (recess portion) can be provided in the vicinity region of the depressed portion on the side face of the first electrode side of the light emitting structure. As the plane shape of the protrusion portion or the recess portion as thus described, a circular shape as shown in the figures is most desirable because of its suitability for high-density arrangement and mass productivity, but an oval shape, a square shape, a rectangular shape, a polygonal shape and a compound shape of these may be used. Further, according to these shapes, the protrusion portions or the recess portions are arranged in a shape appropriately selected from a square/rectangular shape, a parallelogram shape, a triangular shape, a hexagonal (honeycomb) shape and the like, to be arranged in high density. As to dimensions of planes of these structures (protrusion, recess, and groove portions), when the widths thereof are from 0.5 to 5 µm, preferably from 1 to 3 µm, the structures can be preferably manufactured. Further, when the structure portion/protrusion portion 60 is electrically separated from the light emitting structure (examples of FIGS. 1, 2 and 6), as shown in FIG. 3B, the first electrode can be formed as extending to the protrusion portion forming region (extending portion 31p-1), so that the second layer can be separated. Moreover, preferable light scattering function and light guiding function by the first layer can be obtained, and Vf can also be reduced due to an increase in contact area of the first layer. As shown in the figure, the first layer extending to the protrusion portion can be formed in a shape reaching the electrode-side side face 63 and further an upper face 62.

[Protective Film 50]

As shown in FIGS. 1, 2, 3A, etc., openings 51w and 52w may be provided by opening the external connecting portions 33 and 43 of the electrodes to form a protective film covering almost the whole area of other element regions. The protective film is formed of a translucent material when the element structure side is a main light extracting side. Further, the opening may be in a shape formed by opening part of the upper face of the electrode (second layer) as shown in FIGS. 1 and 2, or the protective film may be formed as shown in FIG. 3A such that the lower layer side (translucent film) of the electrode is covered and the upper layer side of the electrode is formed separately from the end of the protective film inside the opening. As the protective film material, a material with high translucency being conventionally known material such as an oxide/nitride of silicon or an oxide of aluminum may be appropriately used according to a light/wavelength of the light emitting element. The protective film is formed as having a film thickness of the order of 0.1 to 3 µm, desirably from 0.2 to 0.6 µm. Further, the end of the protective film in the element region periphery region may be formed substantially identically to the substrate exposed section 10s (groove) as shown in FIG. 1, or may be formed so as to be separated from the exposed section 10s and cover the inside of the element from the top of the first conductive type layer exposed region 22s in the element region 26.

Comparative Example

In a specific example (FIG. 1) of the above first embodiment, when an example of providing the first layer with the same width and area as those of the second layer is compared with an example of providing the first layer smaller than the second layer, e.g. the first layer with its periphery located about 1 µm inside from the periphery of the second layer, a tendency of the specific example of the above first embodiment to have a lower forward voltage and a light output to the same degree or slightly improved is observed. It is therefore considered that, when the second layer having equivalent dimensions as those of the first layer of the specific example, the light output abruptly decreases while the forward voltage is almost at the same level. It is thus considered that there appears significant difference in a high output region where a large current is injected and the large-area light emitting element, and this particularly causes a decrease in power efficiency.

Moreover, although a light emitting element and a light emitting device (resin sealing type shown in FIG. 7B) exceeding 100 lm/W can be realized in the above specific example, the element and device in this comparative example has lower power efficiency, which may be less than 100 m/W.

Second Embodiment

Figure 2A:
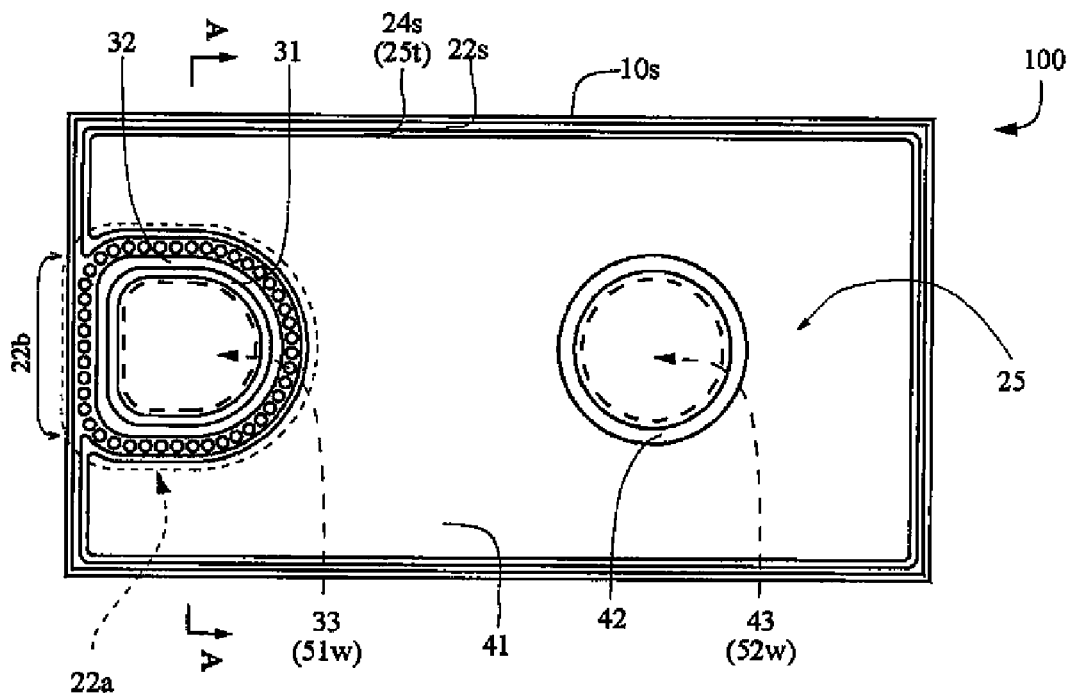
FIG. 2A is a plan schematic view of a light emitting element according to an embodiment of the present invention.
Figure 2B:
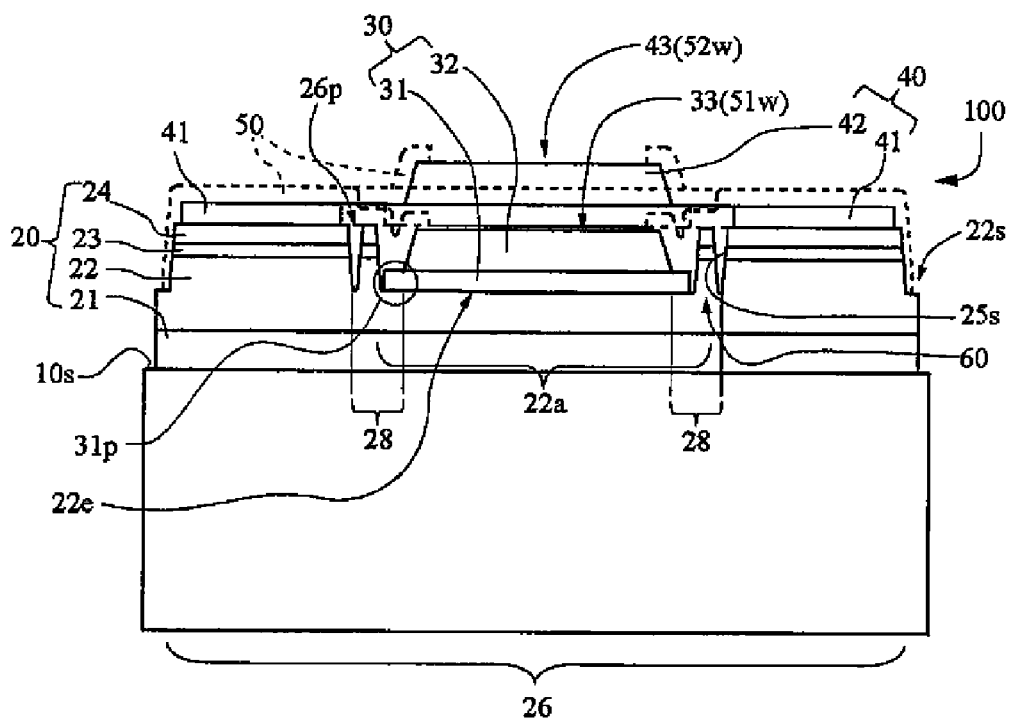
FIG. 2B is a cross-sectional schematic view taken along a line A-A of FIG. 2A.

As a second embodiment, as compared with the LED formed in a substantially square shape of the specific example (FIG. 1) of the above first embodiment, an LED is formed in a rectangular shape with dimensions of 420 µm×240 µm as shown in FIG. 2. This can be produced in the same manner as in the first embodiment. FIG. 2A shows a schematic plan view of this light emitting element, and FIG. 2B shows a schematic cross-sectional view taken along the cutting surface A-A of FIG. 2A.

The depressed portion 22a of the light emitting structure 25 as the forming region 22e of the first electrode 30 is provided as a corner of the light emitting structure on one longitudinal end side of the elongated region of light emitting structure or the light emitting element. Further, the longitudinal direction is opened and the outer edge that surrounds the others is formed in the light emitting structure. Specifically, the outer edge is shaped such that one side of the rectangular electrode forming region is opened. Therefore, both the light emitting structure 25 and the protrusion portion 60 surround the electrode periphery at a larger rate than in the example of FIG. 1. A specific configuration is that about 80% of the peripheral length of the first electrode is surrounded by the light emitting structure, and the whole area of periphery is surrounded by the protrusion portion. As thus described, the outer edge of the first electrode 30 may be different in shape and peripheral length between the light emitting structure 25 and the protrusion portion 60. Since flexibility in arrangement is higher in the protrusion portion/the optical structure portion, it is possible to make the periphery longer than the light emitting structure, and further provide the protrusion portion in the opening of the light emitting structure portion. Moreover, since the light emitting structure 25 is the electrode forming region 22e with part thereof opened, the light confinement is weakened to contribute to light output, which is desirable. Meanwhile, when the optical structure portion blocks the opening and is provided in the whole area of the periphery, a light output/extraction efficiency reducing function can be kept small since the portion is non-light emitting portion. It is therefore possible in this example to obtain a light emitting element excellent in optical characteristics.

[Modification]

In a modification of FIG. 2, a thinner light emitting element can also be formed as shown in FIG. 6. The outside dimensions are 550 μm×150 μm, and the electrode forming region 22e including the external connecting portion 33 is provided at the longitudinal end of the elongated light emitting structure. Unlike the examples of FIGS. 1 and 2, this electrode forming region 22e is not in a shape of the depressed portion that surrounds the electrode but in a shape such that part of the light emitting structure is provided as extending longitudinally along part of the side face of the electrode. Further, the first electrode and the second electrode respectively have extending portions 33 and 34 that extend longitudinally from the external connecting portions 33 and 34 in the vicinity of both longitudinal ends as the respective basic points. The extending portions are provided as opposed to each other in the width direction so as to sandwich the light emitting structure, thereby to extend in parallel. The extending portion of the first electrode is provided adjacently to the light emitting structure, to a position longitudinally separated from the basic point of the second electrode. Similarly, the extending portion of the second electrode is provided to a position separated from the basic point of the first electrode. It should be noted that the region provided with the first electrode extending portion 34 is formed such that the width of the light emitting structure is narrower than the width of another region, e.g. a region longitudinally outside the end of the electrode extending portion 34 such as a region between the electrode extending portion 34 and the outer connecting portion 44, and recessed inward. As thus described, the extending portion enables favorable current spread in the longitudinal direction of the light emitting structure.

In this example, as shown in the figures, a projecting width of the first layer 31 in the electrode region, namely a distance between the end of the second layer 32 and the end of the first layer 31, is formed to be substantially identical. In such a manner, when the second layer is provided according to the extending portion, it is possible to realize preferable current spread especially with respect to the light emitting structure, especially the elongated light emitting structure 25 with a narrow width as in this modification. Meanwhile, when the first electrode is provided so as to cover part of the outer side face of the light emitting structure, and especially the extending portions 34 and 44 to be arranged in parallel on the longitudinal side face are provided, a function to shield light from the light emitting structure 25 is exerted, but as shown in the figure, this function can be suppressed by the provision of the second layer with a narrow width and a small area. Further, the width of the projecting portion on the light emitting structure side is made larger than that of the opposite side thereof so that the second layer is further separated from the light emitting structure, thereby allowing enhancement of the effect. As thus described, in the case of the electrode structure having the extending portion 34, in a configuration where the second layer 32 is provided in the external connecting portion 33 and the second layer is not provided in the electrode extending portion 34, namely the extending length of the second layer is made shorter than that of the first layer, the current spread tends to decrease and the voltage tends to increase. However, since the extending portion of the first layer 31 is provided, light extraction is excellently performed in the low current band. Namely, a light emitting element excellent in low current band can be obtained by being constituted of the external connecting portion having the first and second layers and the extending portion of the first layer extending from the external connecting portion.

Further, unlike the example of FIG. 2, the protrusion portion 60 is provided in the light emitting structure and the peripheral section of the first electrode, namely, almost the whole area of the periphery of the outer edge of the element region, in addition to the region between the first electrode 30 and the light emitting structure portion 25. In such a configuration, it is possible to give preferable directivity in the direction of the normal line of the substrate face to emitted light from the light emitting structure side face.

For consideration of the present invention with respect to this modification, Example 1 of FIG. 6, and as comparative examples thereof, Example 2 without the lower layer 31 and Example 3 without the electrode extending portion 34 of the upper layer 32 (with the extending portion of the lower layer 31) and having the second layer comprised only of the external connecting portion shown by the dotted line portion 33r in the figure are considered. The light emitting elements in the examples with characteristics shown in Table 1 below are obtained when loaded on a φ5 mm bombshell-shaped light emitting device (blue) as in FIG. 7B and then evaluated. Here, dimensions of the semiconductor layer and the electrode structure are the same as in the specific example (square of 320 μm) of the above first embodiment.

TABLE 1

|  | Vf [V] | Output [mW] | W.P.E [%] |
| --- | --- | --- | --- |
| Example 1 (FIG. 6) | 3.23 | 22.6 | 35.0 |
| Example 2 (Without lower layer 31) | 3.23 | 21.6 | 33.4 |
| Example 3 (Without extending portion of upper layer 32) | 3.44 | 22.3 | 32.4 |

As seen from above Table 1, Vf is high in the configuration where the extending portion is comprised only of the lower layer as in Example 3, and the electrode area, and further the occupancy ratio of the covering area, increase due to the extending portion in the configuration where the extending portion/first electrode is comprised only of the upper layer as in Example 2, namely, the light shielding effect by the reflective second layer is enhanced, and thereby the output decreases.

Meanwhile, in Example 1 according to the present invention, light shielding and light loss due to the electrode of the upper layer are reduced by the lower layer with wider cross section than that of the upper layer, and light can be extracted from the lower layer projecting portion projected from the upper layer. Functions of reducing Vf and current diffusion/uniformization by the extending portion are provided to reduce light shielding and light loss as adverse effects caused by the structure so as to improve the output. As a result, a light emitting element with high power efficiency can be obtained. Particularly, when the structure has a narrow width compared with the external connecting portion and the like, as the extending portion, a function to control light refraction as shown in FIG. 3A preferably works, so that an increase in light loss by the provision of the extending portion can be suppressed. Particularly, as shown in FIG. 3A, the light extraction effect on the side 31e opposed to the protrusion portion 31a on the light emitting structure portion side, especially on the element periphery side, is more significant than in the protrusion portion 3a, and thereby the light can be extracted preferably to the element periphery side, namely to the outside of the element.

Further, as shown in this example, in a structure where the extending portion having a length larger than half of the light emitting structure or element on one side of the side face configuration of the light emitting structure, especially on one side of the element outer shape configuration, a light shielding effect on that side, e.g. a light shielding effect against a side-face light emission of the adjacent light emitting structure and a light emission from the exposed face of the electrode forming region 22e, increases. As opposed to this, since the light shielding effect can be reduced in the present invention, the lower layer structure can be preferably used in such an extending portion structure. Particularly when the extending portion has a length larger than half of light emitting structure on the longitudinal constituent side of the elongated light emitting element as in this example, the light shielding effect further increases, so that the light shielding effect reducing function according to the present invention preferably works. At this time, the projecting portion is provided on at least the side opposed to the light emitting structure side 33a, and the element periphery side is preferably formed such that the opposed side is opened from the light emitting structure portion. The projecting portion is further preferably provided on both sides, namely the light emitting structure portion side and the side opposed thereto (element periphery side).

Third Embodiment

Figure 4A:
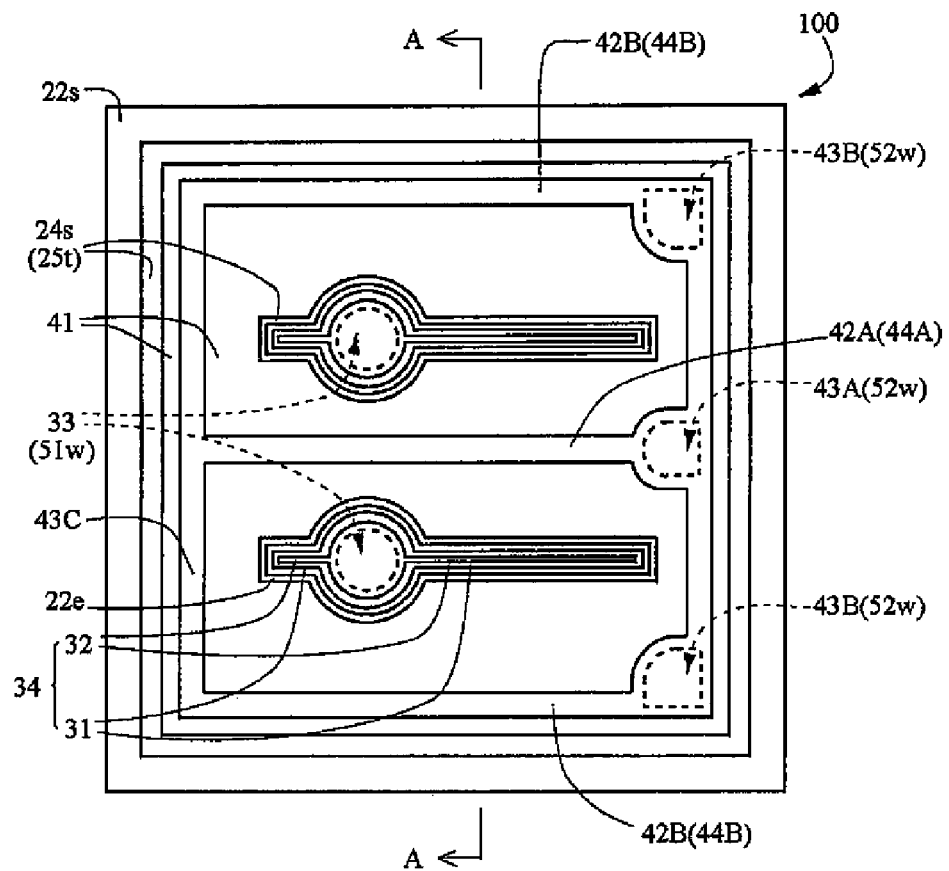
FIG. 4A is a plan schematic view of a light emitting element according to an embodiment of the present invention.
Figure 4B:
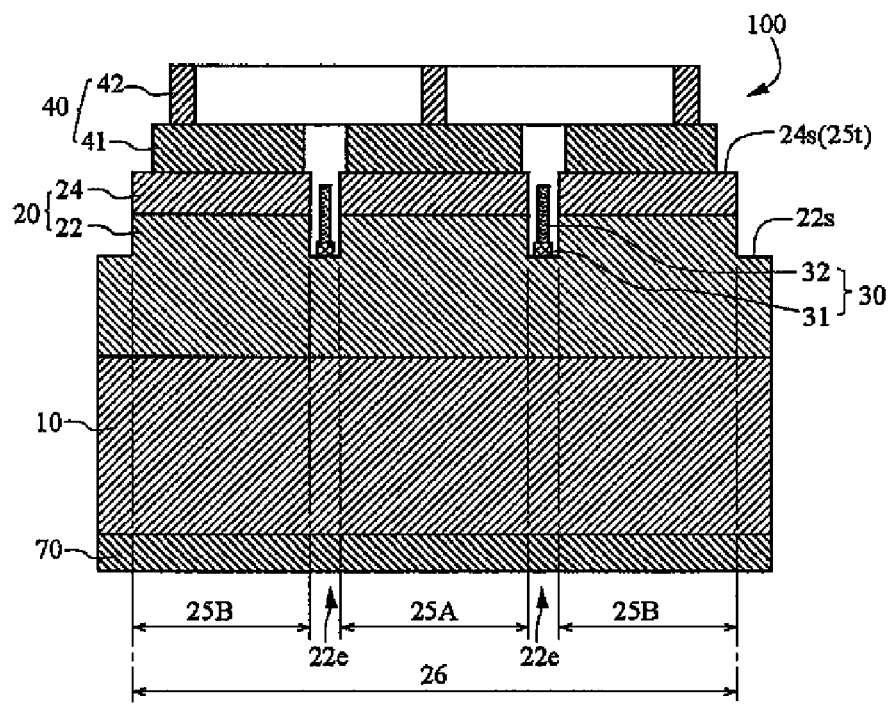
FIG. 4B is a cross-sectional schematic view taken along a line A-A of FIG. 4A.

In an example shown in FIG. 4, two electrode forming regions 22e and two first electrodes 30 are provided inside the light emitting structure 25, and the first electrode is arranged between the light emitting structure portion. Therefore, elongated light emitting structure portions 25A and 25B are structured to be arranged in their width directions alternately with the first electrodes (forming regions 22e), and the first electrodes 30 are structured to have the external connecting portions 33 and 43 with large widths and the extending portions 34 and 44 with narrow widths extending longitudinally from the external connecting portions 33 and 43. In this way, the structure can be formed having the first electrodes 30 arranged in parallel with the elongated light emitting structure portions 25A and 25B and the extending portion 34 of the first electrode 30, which can realize the preferable current spread and light emission. FIG. 4A is a schematic plan view of the light emitting element, and FIG. 4B is a schematic cross-sectional view taken along a line A-A of FIG. 4A. Here, the outside dimensions of the light emitting element is square of 1 mm (1 mm square), and other structures such as external connecting portions of the electrodes can be formed with the dimensions as those in the above example, except for the light emitting structure and the extending portion that concern the size of the element.

Unlike the aforesaid examples (FIGS. 1, 2 and 6), in this example, the structure is formed such that the whole periphery of the electrode forming region 22e is surrounded by the light emitting structure, and the electrode structure has electrode extending portions 34 which extend in two directions with the external connecting portion 33 as a basic point, and in this example, in two longitudinal directions on both sides of the light emitting structure portions 25A and 25B. Similarly, in the second electrode 40 (its upper layer 42), the extending portion 44 that extends longitudinally in the light emitting structure portions is arranged opposite to the first electrode/its extending portion while sandwiching the above-mentioned alternately provided light emitting structure portions 25A and 25B. Moreover, the light emitting structure portions 25A and 25B have the light emitting structure portions therebetween which are coupled with each other in the width direction at both longitudinal ends. According to the annular light emitting structure, the extending portion of the second electrode 40 (second layer 42) are also extended in the width direction (extending portion 43C) so that the rectangular annular extending portion 44 is provided as surrounding the first electrode 30. Here, the external connecting portions 33 and 34 of the first and second electrodes are longitudinally arranged in the vicinity of both ends, opposed to each other to provide the respective connecting portions of the electrodes. The connecting portions of the second electrodes are provided in the vicinity of the longitudinal end portion of three electrode extending portions 42A and 42B.

As this structure, the present invention is preferably applied even to the light emitting element structure provided with a plurality of electrodes, external connecting portions or light emitting structure portions.

Fourth Embodiment

In an example of FIG. 5, a structure is formed such that a plurality of extending portions and light emitting structure portions are provided, as in the third embodiment (FIG. 4). The example of FIG. 5 is different in having a structure where one of the extending portions 34 and 44 is shaped to be bent and branched, as the extending portion 42A of the second electrode provided in the structure portion 25A in the third embodiment. Further, a element structure is formed such that the respective external connecting portions 34 and 44 are provided on the electrode 30, 40 with respect to the plurality of the light emitting structure portions 25A and 25B. The extending portions of the electrodes 30 and 40 have (secondary) extending portions 34B-2 and 42B-2 (42A-2) provided in parallel with the light emitting structure portions 25A and 25B, and (primary) extending portions 34B-1 and 42-1 which wire to the second extending portions and between the extending portions (light emitting structure portions 25A and 25B). With the external connecting portions 34 and 44 taken as basic points, the primary and secondary extending portions are provided and connected to one external connecting portion. Further, the extending portion 34A sandwiched between the inner side light emitting structure portion 25A of the first electrode 30 is configured only of the primary extending portion.

Therefore, unlike the third embodiment (first electrode), the structure is formed such that the extending portions 34 and 44 of the first and second electrodes, the first electrode 30 and the second electrode upper layer 42 are not separated but mutually connected, and further for making such wiring possible, the light emitting structure where each of the electrodes is provided and the first conductive type layer exposed region are mutually connected. Moreover, unlike the examples of the second and third embodiments, the structure is formed such that the lengths of the light emitting structure portions are different, but the mutually connected electrode structures as described above can compensate for the differences, which is desirable. Here, FIG. 5 is a schematic plan view of the light emitting element. Furthermore, the outside dimensions of the light emitting element are square of 600 µm (600 µm square), and other dimensions are almost the same as those in other embodiments, except for the light emitting structure and its extending portion that concern the size of the element.

The electrode structure according to the present invention is also preferably applicable to the example of the above light emitting element as in other embodiments. In particular, the extending portions extend deep inside the light emitting structure, and the electrode forming portions 22e in the extending portions (34B-2, 34A) which are part of the first electrode 30 are formed to be provided deep into the light emitting structure even when being partially opened depressed portions, to have a large light confinement function. However, such a function can be suppressed by the above-mentioned electrode structure, to obtain favorable light emitting properties and power efficiency. In the example of the figure, in the partial extending portion of the depressed portion, the projecting portions have almost the same lengths and widths, to make the width center of the first and second layers almost the same as in the above-described other embodiments. Moreover, as described above, the width centers of the first and second layers can be mutually displaced in each portion of the electrode, the lengths and widths of the projecting portions can be made different, or these can be displaced or made different among each portion.

Fifth Embodiment

Figure 7A:
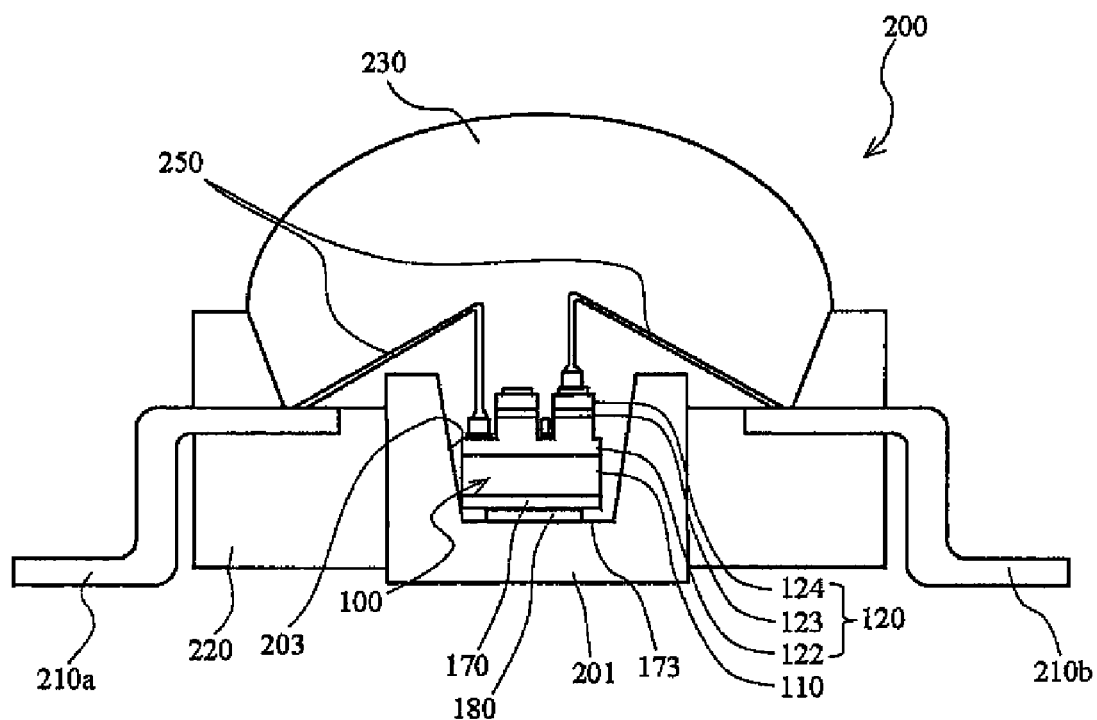
FIG. 7A is a cross-sectional schematic view of a light emitting element according to an embodiment of the present invention.
Figure 7B:
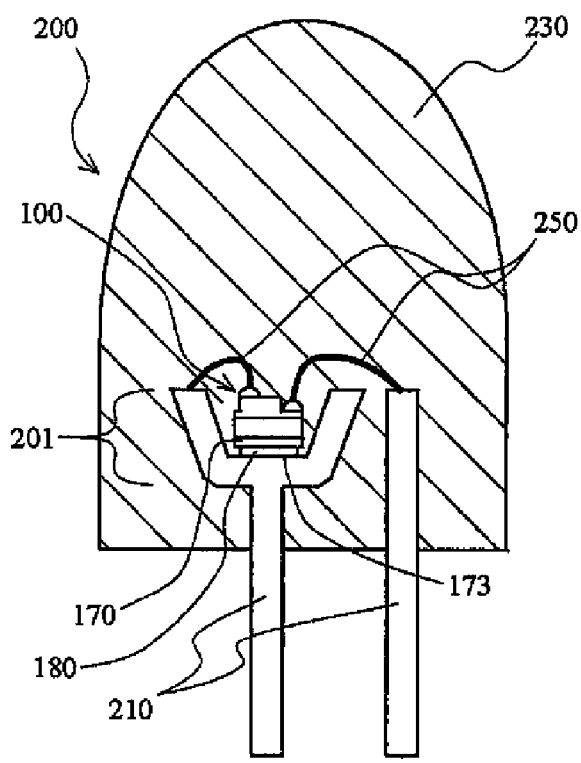
FIG. 7B is a cross-sectional schematic view of a light emitting element according to an embodiment of the present invention.

A light emitting device 200 mounted with the above-mentioned light emitting element 100 is described. As shown in FIGS. 7A and 7B, the light emitting device 200 is structured such that the light emitting element 100 is placed on a light emitting element mounting portion 173 of a substrate/region 201 for mounting. Examples of the mounting substance may include a stem for a light emitting element or a light sensitive element (210 in FIG. 7B), a ceramic substrate for plane mounting, and a plastic substrate, and when a mounting substrate made of AlN or a metal mounting substrate is used as a specific material, a light emitting device with a high radiation property can be obtained, which is desirable. The device may be structured such that a light emitting element is mounted on the mounting face 173 or the like, and the surface of the inside of the device where a light reaches and a reflection face 203 reflects light having a light emission wavelength of the present light emitting device. As a reflective metal, Ag, Al, Rh and the like may be used, and a plated coating film or the like is formed. As shown in FIG. 4, the semiconductor light emitting element 100 provided with a metalized layer 170 such as a reflection layer, eutectic solder, and an adhesive layer 180 on the second main face is mounted on the element mounting portion 173 of the substrate of the device, a housing 220 by thermal compression bonding or the like via the adhesive layer 160. Further, the device is structured such that lead electrodes 210 (a, b) of the light emitting device 200 are connected to the respective electrodes 210 by wires 250 or the like to seal the light emitting element by a sealing member 230. It should be noted that reference numerals 122 to 124 and 110 in the figure correspond to the layers 22 to 23 and the substrate 10 in the light emitting element. In FIG. 7A, a structure is formed such that the substrate 220 of the light emitting device 200 and the electrode leads 210 are provided, and electrically connected to the electrode connecting portion by wires 250, and further sealed by a light transmissive sealing member 230 which seals together with the light emitting element, or by hermetic sealing or the like. The example of FIG. 7B is structured such that the sealing member 230 also serves as a substrate material of the device. As the sealing member, a transparent resin with excellent weather resistance, such as an epoxy resin, a silicone resin, a fluororesin, glass or the like may be used. As the adhesive member 180, in addition to these resin materials, solder such as eutectic solder, a eutectic material, and an Ag paste may be used.

Further, in the examples of FIGS. 4 and 5, as shown in the cross-sectional views, a reflection layer 70 is provided as a metalized layer on a face opposed to the semiconductor structure on the substrate. In the example of FIG. 7, the adhesive layer 180 is provided further on the reflection layer 70.

Moreover, a light conversion member which converts at least part of light of the light emitting element can be provided on a light path between the light emitting element of the light emitting device 200 and an exit aperture of the device, e.g. a lens section in FIG. 7, in the sealing member 230 or the like, to obtain a variety of light emitting colors. Examples of the light conversion member may include a YAG (yttrium aluminum garnet)-based fluorescent material that is preferably used for white light emission of a blue LED, a silicate fluorescent material, a nitride fluorescent material that converts the near-ultraviolet region to the visible light region, to the yellow region to the red region. Especially when the device is used with high brightness for a long period of time, a fluorescent material having a garnet structure is preferably used, such as YAG/TAG, e.g. $(Re_{1-x}Sm_x)_3 (Al_{1-y}Ga_y)_5O_{12}$:Ce ($0 \leq x < 1$, $0 \leq y \leq 1$) where Y, Gd, La, Tb or the like is preferably used for Re. Examples of the nitride-based fluorescent material and an oxynitride fluorescent material may include Sr—Ca—Si—N:Eu, Ca—Si—N:Eu, Sr—Si—N:Eu, Sr—Ca—Si—O—N:Eu, Ca—Si—O—N:Eu, Sr—Si—O—N:Eu and the material is expressed by a general formula: $L_XSi_YN_{(2/3X+4/3Y)}$:Eu or $L_XSi_YO_ZN_{(2/3X+4/3Y-2/3Z)}$:Eu (L is any of Sr, Ca, Sr and Ca). Further, by appropriate use of these fluorescent materials, other fluorescent materials and the like, it is possible to obtain a light emitting device of a desired light emission color.

What is claimed is:

1. A semiconductor light emitting element, comprising:
   first and second semiconductor layers respectively having first and second conductive types;
   first and second electrodes respectively provided on surfaces of the first and second semiconductor layers; and
   a light emitting structure, provided with the second electrode and including the first and second semiconductor layers; and
   a semiconductor structure including the light emitting structure and an exposed surface region of the first semiconductor layer which is extending outward from the second semiconductor layer and provided on the second semiconductor layer side, wherein
   the first electrode provided on the exposed surface region at least has a light transmissive first layer and a reflective second layer, and
   the first layer has projecting portions projected from both sides of the second layer in a cross section of the element, the cross section crossing over the light emitting structure and the first electrode.

2. The semiconductor light emitting element according to claim 1, wherein the exposed region includes a depressed portion depressed into the light emitting structure in a surface of the exposed region, at least part of the first electrode is arranged in the depressed portion, and at least part of the projecting portion is provided in a direction opened from the depressed portion of the light emitting structure on the exposed surface region.

3. The semiconductor light emitting element according to claim 2, wherein the depressed portion surrounds not smaller than half of a peripheral length of the first electrode in the surface of the exposed surface region.

4. The semiconductor light emitting element according to claim 1, wherein the projecting portion of the first layer is provided in a substantially whole area of the periphery of the second layer on the surface of the exposed surface region.

5. The semiconductor light emitting element according to claim 1, wherein the first electrode has an external connecting portion and an extending portion extending from the external connecting portion, and the first and second layers are respectively provided in the external connecting portion and the extending portion.

6. The semiconductor light emitting element according to claim 1, wherein the first electrode is sandwiched between the light emitting structure portions on the exposed surface side.

7. The semiconductor light emitting element according to claim 6, wherein the light emitting structure portion is provided as surrounding a substantially whole area of the periphery of the first electrode.

8. The semiconductor light emitting element according to claim 1, wherein one of the projecting portions on both the sides is disposed on the light emitting structure portion side and the other is disposed on the outside of the element.

9. The semiconductor light emitting element according to claim 1, wherein the first layer comprises metallic compound, metal oxide, or oxide semiconductor, and the second layer comprises metal.

10. The semiconductor light emitting element according to claim 9, wherein a light in the light emitting structure can be extracted outward from the light emitting element at a side of the semiconductor structure where the first and second electrodes are provided.

11. The semiconductor light emitting element according to claim 10, wherein a protective film having light transmissive covers the projecting portion of the first layer.

12. The semiconductor light emitting element according to claim 10, wherein the first electrode is formed of ITO.

13. The semiconductor light emitting element according to claim 11, wherein the first and second semiconductor layers are formed of gallium nitride based semiconductor.

* * * * *